United States Patent
Honda et al.

(10) Patent No.: US 6,201,309 B1
(45) Date of Patent: Mar. 13, 2001

(54) THERMOPLASTIC MATERIAL FOR SEALING A SEMICONDUCTOR ELEMENT, SEMICONDUCTOR DEVICE SEALED BY THE MATERIAL, AND THE PROCESS FOR MANUFACTURING THE SAME

(75) Inventors: Tomoko Honda; Masaki Adachi, both of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/092,990

(22) Filed: Jun. 8, 1998

(30) Foreign Application Priority Data

Jun. 10, 1997 (JP) .................................................... 9-152208
Jul. 23, 1997 (JP) .................................................... 9-197292

(51) Int. Cl.$^7$ ........................................................ H01L 23/29
(52) U.S. Cl. .......................... 257/788; 257/787; 438/124
(58) Field of Search ...................................... 257/788, 787; 438/112, 124, 127, 126

(56) References Cited

U.S. PATENT DOCUMENTS

| | | | | |
|---|---|---|---|---|
| 5,539,218 | * | 7/1996 | Takahama et al. | 257/788 |
| 5,565,709 | * | 10/1996 | Fukushima et al. | 257/788 |
| 5,827,999 | * | 10/1998 | McMillan et al. | 257/787 |

* cited by examiner

*Primary Examiner*—Roy Potter
(74) *Attorney, Agent, or Firm*—Finnegan, Henderson, Farabow, Garrett & Dunner, L.L.P.

(57) ABSTRACT

A reusable packaging material for semiconductor devices. The semiconductor device package is formed from a thermoplastic resin. The resin has good fluidity and good adhesion. The new package is recyclable because the thermoplastic resin hardening process is reversible. The new package has sufficient mechanical strength and adhesion to seal a semiconductor device. A thermoplastic material for sealing a semiconductor element is characterized by 4.5× $10^{-5}$[1/.degree.C.] or less linear thermal expansivity at about 150–200 .degree.C.

27 Claims, 4 Drawing Sheets

THERMOPLASTIC MATERIAL FOR SEALING A SEMICONDUCTOR ELEMENT, SEMICONDUCTOR DEVICE SEALED BY THE MATERIAL, AND THE PROCESS FOR MANUFACTURING THE SAME

BACKGROUND OF THE INVENTION

1. Field of the Invention

The present invention relates to a recyclable resin-scaled type semiconductor device. For example, a semiconductor element mounted on a lead frame is sealed with thermoplastic resin.

2. Description of the Related Art

Semiconductor devices covered by thermosetting resin may be manufactured according to the following method.

A semiconductor element bonded on a lead frame is disposed in a cavity defined by mold. The semiconductor element is interconnected with a lead frame by bonding wires comprised of a conductive material (Cu, Fe—Ni alloy). The cavity has a gate that casts the thermosetting resin into the cavity.

The epoxy resin (thermosetting resin) is cast from the gate. The epoxy resin is heated to the molding temperature by heating the mold, and the epoxy resin hardens. The epoxy resin seals the semiconductor element, the bonding wires, and a part of lead frame. The hardened resin is called a Package. Finally, the mold cools below the molding temperature of the epoxy resin.

As mentioned above, in fluidity and adhesion point of view, the thermosetting resin is applied to manufacturing the semiconductor devices.

About 60 seconds average is required for hardening the thermosetting resin, because of the step of cooling the mold. The required hardening time decreases the productivity of the semiconductor devices.

Further, generally speaking, the thermosetting resin has high fluidity, this characteristic is the cause for easily generated flashes.

Further, the package cannot be recycled because the heat-treated thermosetting resin doesn't have fluidity as before. Thus, unused packaging material must be dumped into a land fill, Unused material results from dividing the semiconductor element from the element board, dividing the package from the semiconductor element, and destroying the package by fire.

If a thermoplastic resin is substituted for the thermosetting resin, about 10 seconds average is required for hardening the thermoplastic resin. The thermoplastic resin can also be recycled because fluidity returns after heat-treating. Thus, waste material may be advantageously reclaimed and reused.

The thermoplastic resin, however, has a lower adhesion than the thermosetting resin. This characteristic allows moisturized air to enter into the semiconductor device through the interface between the package and the lead frame. It is the problem of moisture proof (or wet endurance). Therefore, thermoplastic resin has not been used.

SUMMARY OF THE INVENTION

An object of the present invention is to provide a recyclable semiconductor device. This invention provides a reusable packaging material for semiconductor devices. The new package of semiconductor device is formed from a thermoplastic resin. This thermoplastic resin has good fluidity and good adhesion. The new package is recyclable because the thermoplastic resin's hardening process is a reversible change.

In order to achieve the aforementioned object, there is provided a thermoplastic material for sealing a semiconductor element having $4.5 \times 10^{-5}$[1/.degree.C.] or less linear thermal expansivity at about 150–200 .degree.C.

The invention further provides a thermoplastic material for sealing a semiconductor element being characterized by a ratio of B1 to A1 of 0.55 or more for linear thermal expansivity where A1 is in the direction of flowing the thermoplastic material, and B1 is in the normal direction of flowing the thermoplastic material. This condition may be replaced with a ratio of A1 to B1 of 0.55 or more.

Further, the invention provides a semiconductor device comprising: a semiconductor element, a package formed by the thermoplastic material for sealing the semiconductor element, and a conductor for connecting the semiconductor element to an external element.

Further, the invention provides a process for manufacturing a semiconductor device, comprising the steps of: electrically interconnecting the semiconductor element with the one end of the conductive means, and sealing off the semiconductor element and the one end of the conductive means with a thermoplastic material.

DETAILED DESCRIPTION OF THE PREFERRED EMBODIMENTS

A semiconductor packaging material is made of a thermoplastic material. Substantially no thermosetting material is mixed into the thermoplastic material. The thermoplastic material is recyclable to cut down on industrial waste. The preferred thermoplastic material is substantially free of glass fiber, a filler, such as silica, may be added in an amount up to 75 wt %, but the thermoplastic material may be substantially free of silica fillers.

Figure 1A:
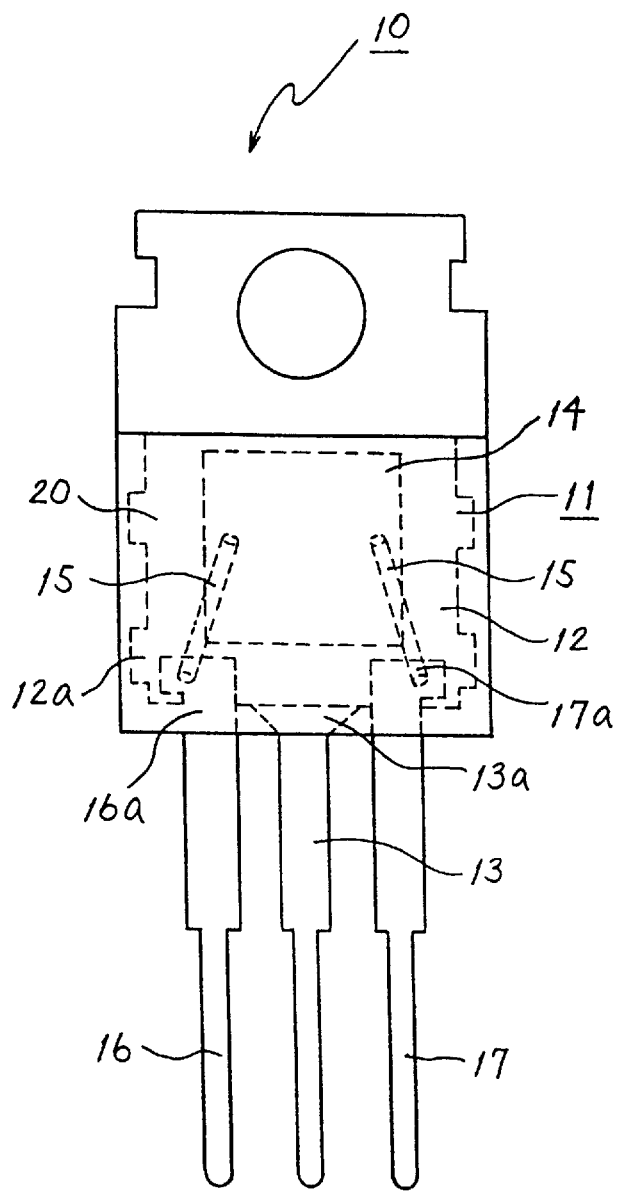
FIGS. 1A and 1B are perspective views showing a bipolar transistor device according to a first embodiment of this invention.
Figure 1B:
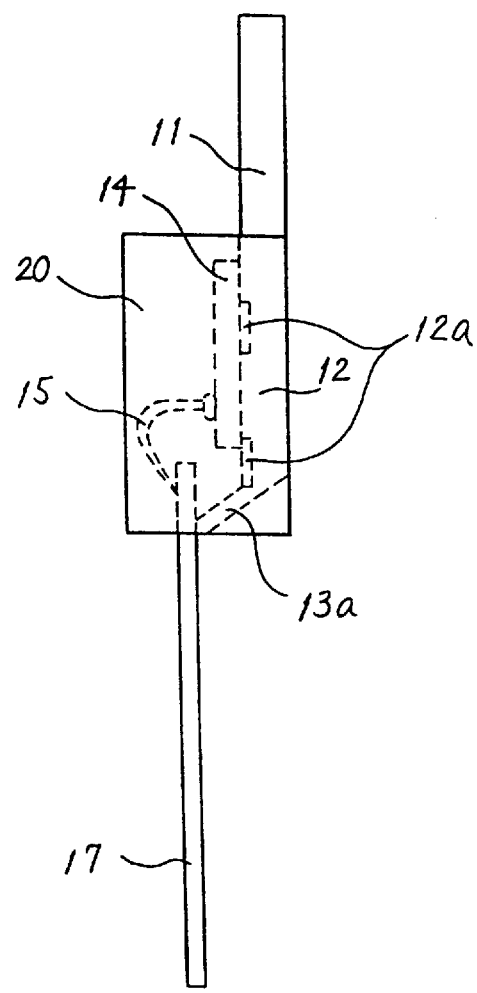

According to the invention's first embodiment, FIGS. 1A and 1B show a semiconductor device 10.

The semiconductor device 10 comprises a semiconductor chip 14, a lead frame 11, a package 20, bonding wires 15, and leads 16 and 17. The semiconductor chip 14 is an integrated circuit including a large number of bipolar power transistor for amplifying. The package 20 is a solid body solidified a thermoplastic material. The package 20 joins all of the semiconductor device components firmly, securely, and immovably.

The conductive lead frame 11 consists of two elements, a bed part 12 and a lead part 13. The semiconductor chip 14 is bonded on to the bed part 12, and lead part 13 extend out of from one end of the package 20. The bed part 12 includes uneven irregularities on its surface. The irregularities from a mooring point to prevent the package 20 from sliding. The bed part 12 also extended out from the package 20 to cool the semiconductor chip 14. If cooling the semiconductor chip 14 is not required, the bed part 12 may be sealed up completely.

The semiconductor chip 14 is covered with a polyimide coat except for the part of electrodes for electrically interconnecting with the leads. The bed part 12 is isolated from the semiconductor chip 14 by the polyimide coat. The polyimide coat provides the moisture proof and the wet endurance of the semiconductor device 10. The polyimide coat strengthens the mechanical strength of the semiconductor chip 14. The polyimide coat also improves the impact resistance of the semiconductor device 10.

The leads 16 and 17 are arranged in parallel alignment to the lead part 13 and each other. Lead ends 16*a* and 17*a* of the leads 16 and 17 are interconnected to an Input/Output terminal part of the semiconductor chip 14 with the bonding wire 15. The bonding wire 15 consists of a good conductive material (e.g. fine metal of Au or Al), and the diameter is about 200 micron.

An addition agent is added to the thermoplastic material which composes the package 20 to intensify adhesion. One example addition agent is an acid anhydrous phosphorate elastmor e.g. the copolymer of the acrylic acid and the Maleic anhydride. The preferred acid anhydrous phosphorate elastmor has at least one polar group —COH. On the other hand, —OH polar groups have been attached to that the general lead frame consisting of Cu or 42Alloy or etc. on the surface. The —COH polar groups and the —OH polar groups improve the adhesion of the thermoplastic material, because the polar groups generate a polar bond of H—COOH. As mentioned above, in the case of adoption as addition agent, it is agreeable that the addition agent improves the adhesion by interacting each polar groups on surface.

Grained particles as filler are added to the thermoplastic material. A substantial amount of grained particles may be used. The fine-grained silica as the particle is effective against inhibiting the anisotropy of the linear thermal expansivity of the thermoplastic material and reducing the absolute value of the linear thermal expansivity of the thermoplastic material. The anisotropy of the linear thermal expansivity affects the adhesion of the thermoplastic material badly. The fine-grained silica's has a 10 micron average diameter. Other materials useful as fillers are fine grained silicate, ceramics, or mica.

A fibrous material is not added to the package 20 formed by the thermoplastic material. It is the reason why the fibrous material (e.g. a glass fiber) is effective against encouraging the anisotropy of the linear thermal expansivity of the thermoplastic material. Especially, the essence of the soda glass included in the glass fiber dissolves in the thermoplastic material. Na ion and Cl ion are included in the dissolved glass fiber. This is a factor of decreasing the lifetime. On the other hand, in the case of recycling the package 20, a recycle process has a step of kneading the thermoplastic material. The fibrous material is torn up in this step. Therefore, there is no need to use the fibrous material. Whether somebody likes it or not, in case of insisting on adding the fibrous material, it may be allowed if it will not spoil the recyclable property after a step of kneading. The material become more suitable for the semiconductor package because it approaches 1.0 that a ratio for linear thermal expansivity in the direction of flowing the thermoplastic material and in the normal direction of flowing the thermoplastic material, The preferred thermoplastic part of the thermoplastic material is a Polyphenylene Sulfide (PPS). Thermosetting material is preferably not included in the packaging material. The thermoplastic material is colored black to shield light. The package 20 is formed by an injection molding method. It is the injection condition that the mold temperature is 130 .degree.C.; the soluble material temperature is 330 .degree.C.; the hypothetical viscosity at the time of passing by the gate is 300[Pa.s]; and the holding pressure is 120 [MPa].

The semiconductor device 10 is formed by the following steps: a step for bonding the semiconductor chip 14 onto the lead frame 11; a step for interconnecting the semiconductor chip 14 to the lead frame 11 by the bonding wire 15; a step for setting the lead frame 11 on the cavity of the mold; a step for injecting the thermoplastic material into the mold; and a step for cooling the mold to solidify the thermoplastic material.

The physical characteristic of the semiconductor device being formed with the thermoplastic material will now be explained.

The package is formed with thermoplastic material that includes an addition agent. Generally, in the case of adding the addition agent, the thermoplastic material's mechanical strength decreases. When the thermoplastic material's mechanical strength is lowered, the package 20 is often broken by drawing the lead part.

A lead part tensile test is performed. The lead part tensile test was the test of measuring tensile strength of the lead at the time when the lead part is destroyed by drawing with a tension speed of 10[mm/min] under mooring the package 20. The package possessing the flexural strength over 74[MPa] proved adequately fit for practical use as the result of the tests. Therefore, the allowable volume of addition agent is the corresponding amount to the flexural strength 74[MPa] or more.

Figure 2:
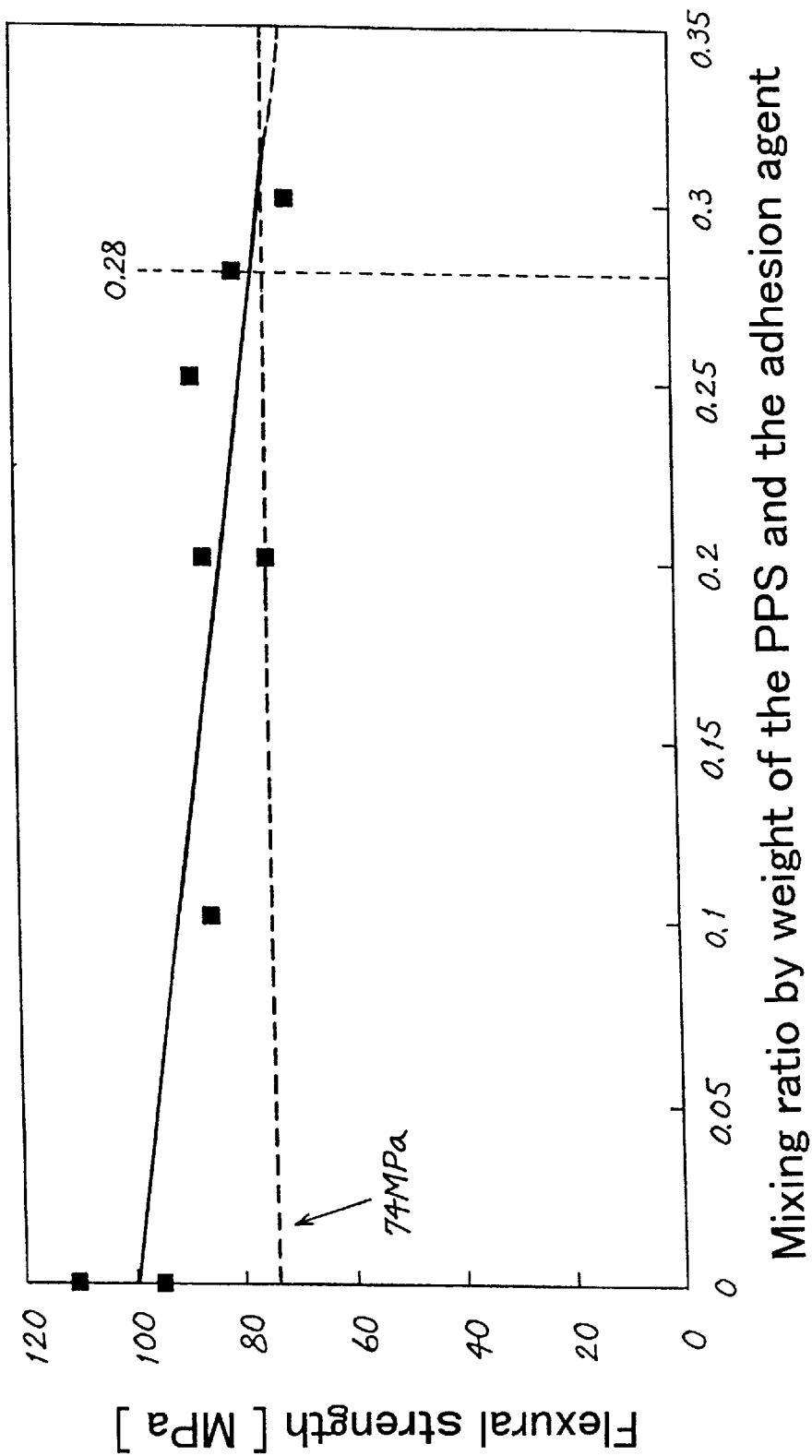
FIG. 2 is a graph showing relation of the flexural strength of a semiconductor package as the vertical axis and the addition ratio by weight of the addition agent against the thermoplastic resin as the horizontal axis.

The relationship of the mixing ratio by weight between the thermoplastic resin and the addition agent is investigated, because the addition amount of the silica is irrelevant to the flexural strength's change. FIG. 2 shows the result of the investigation. The package 20 keeps the flexural strength over 74[MPa] till the addition amount of the addition agent is 0.28 or less mixing ratio by weight. Therefore, the upper limitation of the mixing ratio by weight of the thermoplastic resin and the addition agent is 0.28.

Figure 3:
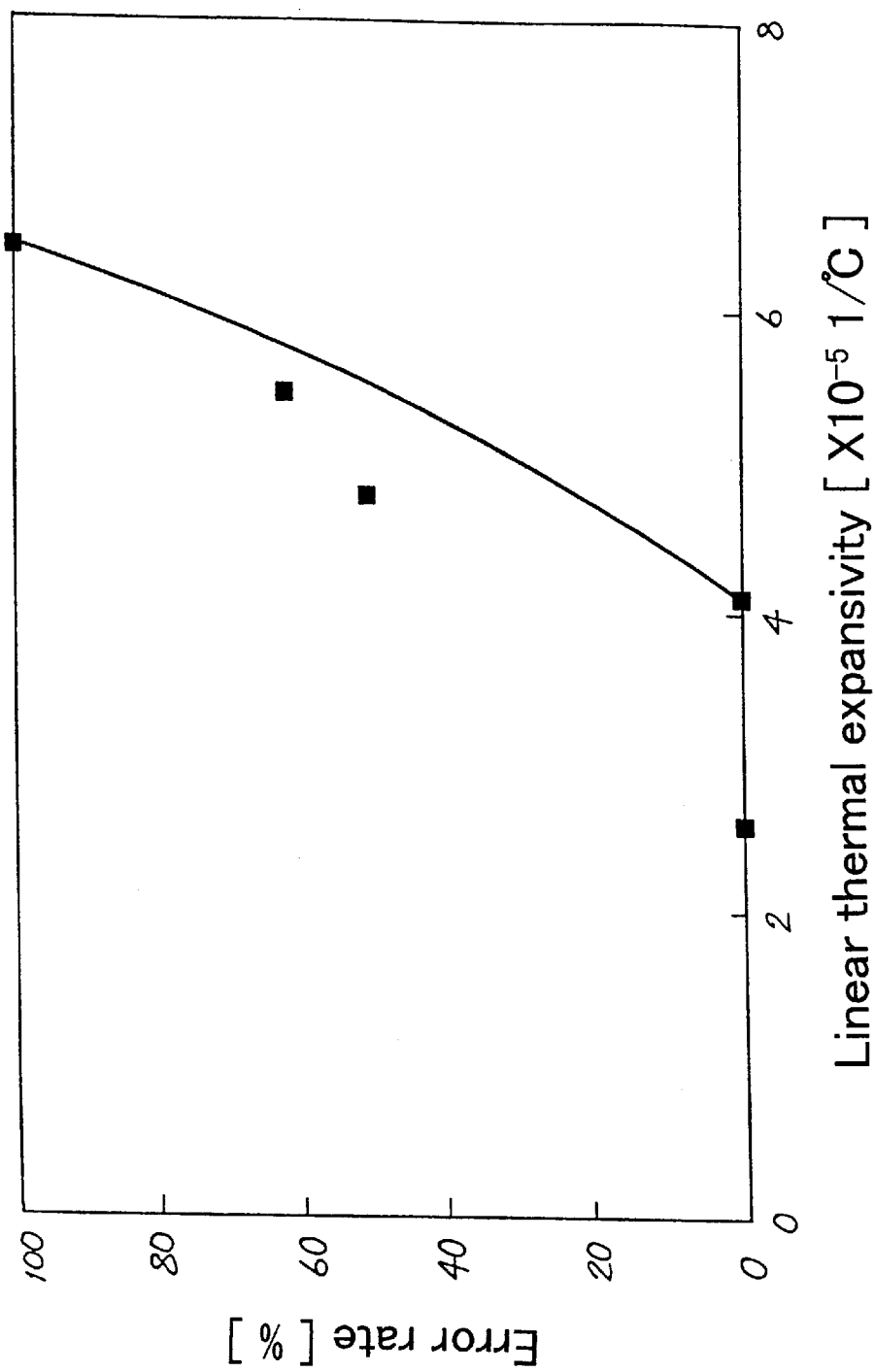
FIG. 3 is a graph showing the incidence of the substandard article under the TCT as the vertical axis and the linear thermal expansivity in the direction of flowing the thermoplastic material as the horizontal axis.
Figure 4:
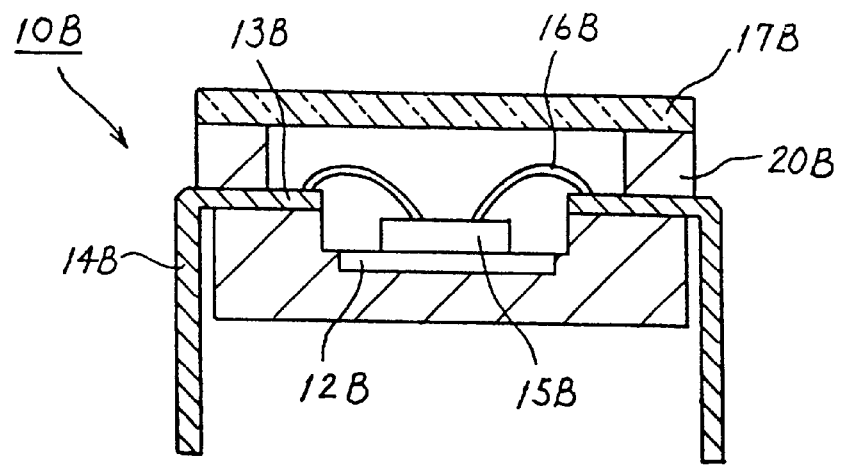
FIG. 4 is cross sectional view showing a CCD according to a second embodiment of this invention.

FIG. 3 shows the experimental results of the temperature cycle test (TCT). The TCT gives the temperature cycle (−65(30 min.)~25(5 min.)~150(30 min.)) to the semiconductor device. After repeating a predetermined number cycles, the semiconductor device is compared with the original. The semiconductor device is evaluated as poor if the electric characteristic changes by some 5% against the original.

The thermoplastic material's adhesion isn't degraded easily in the case of the temperature −65 .degree.C. But, in the case of the temperature 150 .degree.C., the thermoplastic material's adhesion is degraded easily. We ascertained that what adhesion is degraded in the high temperature relates to the linear thermal expansivity in the thermoplastic material. Especially, in the case of the high temperature (near the melting point), it is important that the ratio of a linear thermal expansivity A1 in the direction of flowing the thermoplastic material to a linear thermal expansivity B1 in the normal direction of flowing the thermoplastic material be 0.55 or more.

By the way, the glass transition point of the thermoplastic resin (PPS) is about 100 C. Therefore, it is presumed that the inflection point of the PPS's linear thermal expansivity is about 100 C, too. But the inflection point can not be clearly determined. The linear thermal expansivity in the temperature range over 150 C can be clearly determined. When measuring the linear thermal expansivity, a probe put on the thermoplastic material has been used. But the probe has the impossible measurement range of the delicacy change of the thermoplastic material, because the probe sinks in the thermoplastic material at temperatures over 200 C. Therefore, it is seemed that the regulatable temperature range of the thermoplastic material is in the region of 150–200 C.

Under this consideration, a TCT was performed for the thermoplastic material of $6.4 \times 10^{-5}$[1/.degree.C.] or less linear thermal expansivity at the temperature of 150 to 200 C. The following two facts image from FIG. 2.

(i) In the case of the thermoplastic material of $4.75 \times 10^{-5}$[1/.degree.C.] or more linear thermal expansivity at the temperature 150–200, it become a substandard product.

(ii) In the case of the thermoplastic material of $2.5 \times 10^{-5}$[1/.degree.C.] linear thermal expansivity at the temperature 150–200, no problems occurred.

Table 1 shows the experimental results under the TCT conformed to the standards of JIS C 7021:A-4, JIS C 7022:A-4, MIL-STD-750:1051, or MIL-STD-883:1010. Samples of this experiment are different mixture ratio by weight of the addition agent and the PPS and so on. 1 lot consists of 10 equal condition samples. 7 lots are tested (1 mixture condition per 1 lot) under the TCT. The TCT gives the temperature cycle (−65(30 min.)~25(5 min.)~150(30 min.)) to the semiconductor devices. After repeating 100, 200, and 300 cycles, the semiconductor devices were compared with the original. The semiconductor devices are evaluated as poor if the electric characteristic changed by some 5% against the original. The samples are divided into the following two groups according the size of the sealed semiconductor element. The element size of the group A is 3.8 mm square. The element size of the group B is 6.5 mm square.

Table 1

The defective proportion of the group B is the higher than group A. We understand that at least the sample 1 and sample 2 don't reach the necessary adhesion. Further, the amount of necessary adhesion depends on the size of the sealed semiconductor element in the case of the sample 2.

We reach the following conclusion depending on that we piled the experiment under the different condition samples.

The thermoplastic material should preferably have a ratio of 0.55 or more of B1 to the A1 for linear thermal expansivity where A1 is in the direction of flowing the thermoplastic material and B1 is in the normal direction of flowing the thermoplastic material. This test is about B1/A1 in case of that the A1 is larger than the B1, if in case of that the B1 is larger than the A1, the thermoplastic material should preferably have a ratio of 0.55 or more of A1/B1. In other words, it should be preferably that the B1/A1 or the A1/B1 is nearly 1.0.

As shown in Table 1, the 30 wt %–75 wt % of silica is added to the thermoplastic material. The amount of silica, however may be as low as 0%. The samples shown in table 1 were selected for comparison. If more than 75% is added the material maybe be not able to be properly kneaded.

Generally speaking, the fillers are added in order to increase the mechanical strength of the package. This fact is shown in the table 1. The fibrous material as the filler takes the greater effect than the silica. Therefore, the amount of silica may be less than in samples 1 and 2.

The ratio of the linear thermal expansivity at the sample 1 and 2 wherein the silica mixing ratio is 30 wt % is low. But, the sample 7 wherein the silica mixing ratio is 75 wt % also has a low linear thermal expansivity ratio as compared with the other samples. Therefore, the mixing ratio of the silica is apparently not related to increase the ratio of the linear thermal expansivity. In the case of table 1, only the glass fiber is apparently related to the increase of the linear expansivity ratio. The silica itself has no viscosity. On the other hand, the resin itself has a little viscosity. The flexural strength is increased according as adding the glass fiber. However, in case of this condition, the package is not elastic according as the change of the lead frame. So, the amount by weight of the PPS at the sample 1 and 2 is greater than the other samples in order to improve the adhesion. If the amount of the silica is the greater than the sample 1, or if the amount of the PPS is the less than the sample 1, the error rate of its material will increase.

Next, a long life time reliability test is conducted. Table 2 shows the experimental results under the TCT and the pressure cooker test (PCT) conformed to the standards of EIAJ SD-121:18,or EIAJ IC-121:18. Samples of this experiment are different mixture ratio by weight of the addition agent and the PPS and so on as shown in Table 2. 1 lot consists of 25 equal condition samples. 7 lots are tested (1 mixture condition per 1 lot) under the TCT and the PCT. The PCT requires the semiconductor devices to stand 500 hours under 1[atm], and 121[.degree.C.]. The TCT gives the temperature cycle (−65(30 min.)~25(5 min.)~150(30 min.)) to the semiconductor device. After repeating 500, and 1000 cycles, the semiconductor device was compared with the original. In either case, the semiconductor device is evaluated as a poor article if the electric characteristic changes by some 5% against the original.

Table 2

The following two facts are verified by data of Table 2.

(i) It was correct to consider the thermoplastic material up to this point.

(ii) If the addition agent is not added to the thermoplastic material, it increases a substandard product under the long life time reliability test (PCT).

From the data described above, the following conditions are preferred to get the thermoplastic material for sealing a semiconductor element.

(i) On the wet endurance point of view, a thermoplastic material of $4.75 \times 10^{-5}$[1/.degree.C.] or less linear thermal expansivity at the temperature 150 to 200. A thermoplastic material should preferably have a ratio of 0.55 or of B1 to A1 for the linear thermal expansivity where A1 is in the direction of flowing the thermoplastic material and B1 is in the normal direction. It is preferable that said linear thermal expansivity ratio is nearly 1.0. Therefore, it is not desirable that a fibrous material is added the thermoplastic material. It is allowable that the ratio for the linear thermal expansivity is 1.0 and over.

(ii) On the long life time reliability point of view, the addition agent is added to the thermoplastic material under the condition that the upper limitation of the 0.28 mixing ratio by weight of the thermoplastic resin and the addition agent. This condition satisfies the flexural strength 74[MPa] or more as the suitable thermoplastic material for sealing the semiconductor device.

Figure 5:
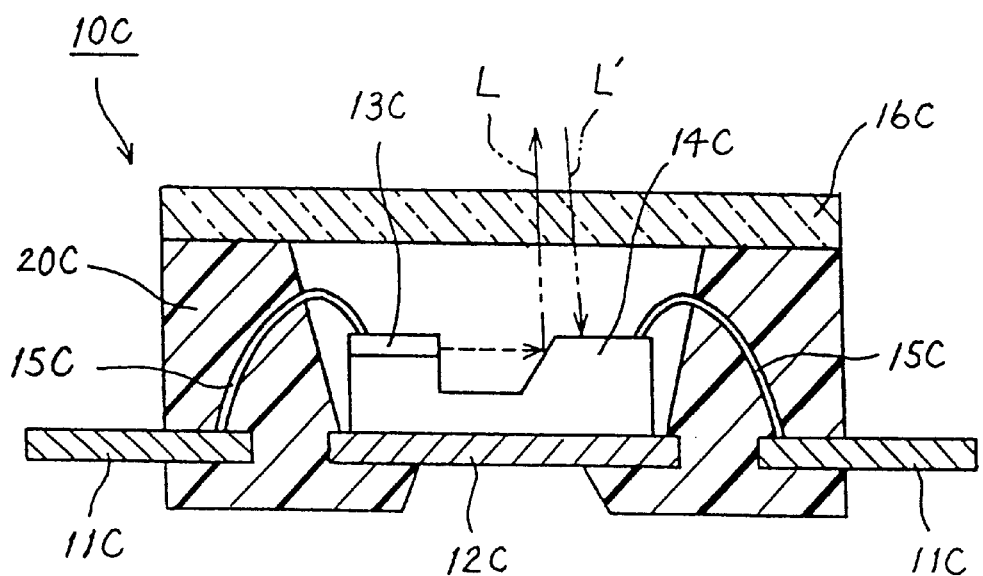
FIG. 5 is cross sectional view showing an IOU according to a third embodiment of this invention.

As this invention's second embodiment, FIG. 5 shows a CCD (charge coupled device) equipment 10B. The CCD 10B comprises a CCD element 15B, a lead frame, a hollow package 20B, bonding wires 16B, and leads 14B. The hollow package 20B is a solid body solidified a thermoplastic material. The package 20 joins all of the semiconductor device components firmly, securely, and immovably. The hollow part consists of the transparent glass plate 17B and the solid body.

The conductive lead frame consists of the following three elements, a bed part 12B, an inner lead part 13B, and an outer lead part 14B. The CCD element 15B as a semiconductor element is bonded on to the bed part 12B. The CCD element size is 1.8 mm×3.0 mm. The CCD element 15B and the bed part 12B are arranged in the hollow part of the hollow package 20B. The light reception plane of the CCD element 15B is directed to the glass plate 17B. The inner leads 13B are interconnected to a Input/Output terminal part of the CCD element 15B with the bonding wire 16B. The bonding wire 16B consists of a good conductive material (ex. Au/Al), and the diameter is about 25 micron. The outer leads 14B connect to an Input/Output terminal part of another component.

The preferred thermoplastic part of the thermoplastic material is the PPS. Thermosetting material is preferably not included in the packaging material. The thermoplastic material is colored black to shield light. The package 20B is formed by an injection molding method. It is the injection condition that the mold temperature is 155 .degree.C.; the soluble material temperature is 340 .degree.C.; the hypothetical viscosity at the time of passing by the gate is 300[Pa.s]; and the holding pressure is 120[MPa].

The CCD equipment 10B is formed by the following steps: the step for bonding the CCD element 15B onto the lead frame, the step for interconnecting the CCD element 15B to the lead frame by the bonding wire 16B, the step for setting the lead frame on the cavity of the mold, the step for injecting the thermoplastic material into the mold, the step for cooling the mold to solidify the thermoplastic material, and the step for putting a glass plate 17B on the solid body.

The thermoplastic material satisfies the following:

i) a thermoplastic material of $4.75 \times 10^{-5}$[1/.degree.C.] or less linear thermal expansivity at the temperature 150 to 200 C, ii) a thermoplastic material with a ratio of 0.55 or more of linear thermal expansivity, iii) an addition agent added to the thermoplastic material under the condition that the 0.28 mixing ratio by weight of the thermoplastic resin and the addition agent. Condition iii satisfies the flexural strength 74[MPa] or more as the suitable thermoplastic material for sealing the semiconductor device.

Table 3 shows the experimental results under the TCT and the high temperature neglect test (HTN). 1 lot consists of 3 equal condition samples. 6 lots are tested (1 mixture condition per 1 lot) under the TCT. The TCT give the temperature cycle (−65(30 min.)~25(5 min.)~150(30 min.)) to the semiconductor device. After repeating 150 cycles, the semiconductor device was compared with the original. The semiconductor device is evaluated as if the electric characteristic changes by some 5% against the original. The HTN test requires the semiconductor devices to stand 400 hours under 60 degrees centigrade, 90% humidity. And observing the semiconductor devices after 150 hours and 400 hours. Judging it to be good quality (O) if no dew condenses between the lead and the package, or judging it to be bad quality (X) if dew condenses between the lead and the package.

Table 3

As reflected in Table 3, the thermoplastic material performs well as a sealing material, and if an addition agent is not added to the thermoplastic material, the material cannot maintain the wet endurance under extreme conditions for a long time.

As this invention's second embodiment, FIG. 6 shows an IOU (Integrated Optical Unit) 10C. The IOU 10C comprises a laser diode 15B, a lead frame, a hollow package 20C, bonding wires 15C, and a photo diode 14C. The hollow package 20B is a solid body solidified the thermoplastic material. The package 20 joins all of the semiconductor device components firmly and secure them immovable. The hollow part consists of the transparent glass plate 16C and the solid body.

A conductive lead frame consists of the following two elements, a bed part 12C, and a lead part 11C. The laser diode 13C as a semiconductor element is bonded on to the bed part 12C. The laser diode size is 0.3 mm×0.8 mm. The laser diode 13C and the bed part 12C are arranged in the hollow part of the hollow package 20C. The light reception plane of the photo diode 14C is directed to the glass plate 16C. The photo diode size is 3.8 mm×6.0 mm.

The laser diode 13C radiates a laser beam L. The outgoing beam L is reflected by the reflector e.g. a optical disk. The reflected beam becomes an incoming beam L'. The incoming beam L' makes a image formation onto the light reception end of the photo diode 14C through the glass plate 16C. The photo diode 14C generates an electric signal in response to the image. The electric signal is outputted by transmitting in the leads 11C and bonding wire 15C. The leads 11C connect to an Input/Output terminal part of the laser diode 13C and the photo diode 14C with the bonding wire 15C. The bonding wire 15C consists of a good conductive material (e.g. fine metal of Au or Al), and the diameter is about 25 micron. The end of the leads 11C is to be interconnected to a Input/Output terminal part of another component.

The preferred thermoplastic part of the thermoplastic material is PPS. Thermosetting material is preferably not included. The thermoplastic material is colored black to shield light. The package 20C is formed by an injection molding method. It is the injection condition that the mold temperature is 155 .degree.C.; the soluble material temperature is 340 .degree.C.; the hypothetical viscosity at the time of passing by the gate is 300[Pa.s]; and the holding pressure is 120[MPa]. The IOU 10C is formed by the following steps: the step for bonding the laser diode 13C and the photo diode 14C onto the lead frame, the step for interconnecting the laser diode 13C and photo diode 14C to the lead frame by the bonding wire 15C, the step for setting the lead frame on the cavity of the mold, the step for injecting the thermoplastic material into the mold, the step for cooling the mold to solidify the thermoplastic material, and the step for putting a glass plate 16C on the solid body.

The thermoplastic material satisfies the following:
i) a thermoplastic material of $4.75 \times 10^{-5}$[1/.degree.C.] or less linear thermal expansivity at the temperature 150 to 200 C,
ii) a thermoplastic material with a ratio of 0.55 or more of linear thermal expansivity, and
iii) an addition agent is added to the thermoplastic material under the condition that the 0.28 mixing ratio by weight of the thermoplastic resin and the addition agent. Condition iii satisfies the flexural strength 74[MPa] or more as the suitable thermoplastic material for sealing the semiconductor device.

The IOU 10C is suitable for the optical data reproducing head of an optical disk player or recorder. Regarding productivity and production cost, the package formed by the thermoplastic material is better than a package formed by metal. As above case, the semiconductor device sealed by a thermoplastic material increases the productivity of the application products.

This invention should not be restricted by the scope and descriptions of the embodiments. Rather, modification are possible within the scope of the invention as will be appreciated by one of ordinary skill in the art.

For example, it can be enumerated the LCP (Liquid crystal Polymer), PEEK (Polyetheretherketone), PEN (Polyethernitrile), and PES (Polyethersulphone) as the substitute of said thermoplastic resin, it is usable if the substitute was the thermoplastic resin.

On the other hand, the semiconductor element is usable for calculating, for radiating, for receiving a light, for amplifying, for memorizing, or etc.

On the other hand, in the case of that applying to the product of the comparatively short product life (e.g. the personal computer, the electronic calculator, the thermometer), it is permitted the addition agent is not added. In the case of that applying to the region of the power electronics (e.g. the actuator, the amplifier, the power station), it is desired that the addition agent is added to it.

On the other hand, a flip-chip packaging method by solder balls is substituted for the lead frame as the conductive means for interconnecting the semiconductor element with the other electric components.

On the other hand, the thermosetting resin or fibrous materials can be mixed in the thermoplastic materials of our invention when the thermoplastic materials keep the above-mentioned condition, the range of linear thermal expansivity and the ratio of them in the two directions, and do not change the thermoplastic characteristics of the materials to the thermosetting characteristics after mixing.

As mentioned above, the following conditions are preferred for a thermoplastic material for sealing a semiconductor element:

(i) a thermoplastic material of $4.75 \times 10^{-5}$[1/.degree.C.] or less linear thermal expansivity at a high temperature region, (ii) a thermoplastic material with ratio of 0.55 or more of linear thermal expansivity. It is more preferable that said linear thermal expansivity ratio is nearly 1.0. Therefore, it is not desirable that a fibrous material is added the thermoplastic material, (iii) an addition agent is added to the thermoplastic material under the condition that the upper limitation of the mixing ratio by weight of the thermoplastic resin and the addition agent is 0.28. This condition satisfies the 74[MPa] or more flexural strength, and (iv) Packages formed from said thermoplasstic material are recyclable.

In case of that thermosetting materials or fibrous materials were mingled wit h a thermoplastic material, if the thermoplastic material has the mentioned con dition, the thermoplastic material will achieve anticipated purpose and efficacy.

When a transistor element was selected from the group of the semiconductor devices, we measured the electric current Iceo of the transistor element for testing the electric characteristics. In other case we measured the voltages Vcbo, Vceo, Vebo, etc. instead of the electric current Iceo for testing because the these voltage parameters could be more sensitive than current parameters. Therefore, in dependence on how to choose the standard parameter, the required condition of the thermoplastic material of our invention maybe shift to the higher or lower specification than above-mentioned condition.

We measured the flexural strength of the materials of our invention under the JIS K-7171. The size of the cast sample was 127 mm (length)×12.6 mm (width)×3.2 mm (thickness). The length direction of the cast sample was the flow direction of the material in our invention. First the cast samples were left in the conditions of 23 C (temperature) and 50%Rh (humidity) for 24 hours. Then the cast samples were measured the flexural strength in the same temperature and humidity conditions using the experiment apparatus ABM/RTA-500 made by Orientec corporation. Other measuring conditions were 5 mm (the pointing end radius of the pressure probe of the apparatus), 50 mm (the interval between the fulcrums), and 2.0 mm/min (press speed on the sample in testing). The sample was supported by a pair of fulcrums at the ends of the sample on its back. The pointing end of the pressure probe was pressed down in the middle of the sample.

We measured the flexural strength of the materials of our invention under the JIS K-7197. The size of the cast sample was 7 mm (length)×12 mm (width)×3.2 mm (thickness). The cast sample was detached from the casts made with the casting machine having a casting gate, wherein the cast sample was cut from a cast 80 mm away from the casting gate. The linear thermal expansivity of the cast samples were measured in the atmosphere using the Heat/Moment/Strain measurement apparatus TMA-120 made by Seiko Instruments Inc. and an aluminum pole for length proofreading. The size of the aluminum pole was 5 mm (diameter)×10 mm (length). The above-mentioned condition of the linear thermal expansivity is the average of the 3 cast samples, wherein the 3 cast samples were randomly sampled from the mass samples.

TABLE 1

| | mixing ratio [wt %] | | | | characteristic | | | | TCT [the number of poor sample/all sample] | | | | | |
|---|---|---|---|---|---|---|---|---|---|---|---|---|---|---|
| | | | | | linear thermal expansivity × $10^{-5}$ [1/C] | | | | 100 [cycle] | | 200 [cycle] | | 300 [cycle] | |
| sample No. | silica | PPS | adhesion agent | glass fiber | flow ($\alpha$) | normal ($\beta$) | ratio ($\alpha/\beta$) | strength [MPa] | group A | group B | group A | group B | group A | group B |
| 1 | 30 | 35 | 5 | 30 | 1.3 | 6.1 | 0.21 | 141.0 | 10/10 | 10/10 | — | — | — | — |
| 2 | 30 | 40 | 0 | 30 | 1.9 | 6.7 | 0.28 | 180.0 | 3/10 | 7/10 | 10/10 | 10/10 | — | — |
| 3 | 75 | 25 | 0 | 0 | 2.5 | 3.1 | 0.81 | 87.4 | 0/10 | 0/10 | 0/10 | 0/10 | 0/10 | 0/10 |
| 4 | 69 | 28 | 3 | 0 | 2.8 | 4.5 | 0.62 | 87.4 | 0/10 | 0/10 | 0/10 | 0/10 | 0/10 | 0/10 |
| 5 | 70 | 25 | 5 | 0 | 2.7 | 3.5 | 0.77 | 95.0 | 0/10 | 0/10 | 0/10 | 0/10 | 0/10 | 0/10 |
| 6 | 70 | 25 | 5 | 0 | 2.7 | 4.3 | 0.63 | 74.0 | 0/10 | 0/10 | 0/10 | 0/10 | 0/10 | 0/10 |
| 7 | 75 | 19.5 | 5.5 | 0 | 2.5 | 4.5 | 0.55 | 80.0 | 0/10 | 0/10 | 0/10 | 0/10 | 0/10 | 0/10 |

TABLE 2

| | mixing ratio [wt %] | | | | characteristic | | | | PCT [poor/samples] | TCT [poor/samples] | |
|---|---|---|---|---|---|---|---|---|---|---|---|
| | | | | | linear thermal expansivity × $10^{-5}$ [1/C] | | | | 500 [H] | 500 [cycle] | 1000 [cycle] |
| sample No. | silica | PPS | adhesion agent | glass fiber | flow ($\alpha$) | normal ($\beta$) | ratio ($\alpha/\beta$) | strength [MPa] | | | |
| 1 | 70 | 30 | 0 | 0 | 2.9 | 4.7 | 0.62 | 110.1 | 1/25 | 0/25 | 0/25 |
| 2 | 69 | 28 | 3 | 0 | 2.8 | 4.5 | 0.62 | 85.0 | 0/25 | 0/25 | 0/25 |
| 3 | 75 | 25 | 0 | 0 | 2.7 | 3.5 | 0.77 | 95.0 | 3/25 | 0/25 | 0/25 |
| 4 | 75 | 20 | 5 | 0 | 2.5 | 3.1 | 0.81 | 87.4 | 0/25 | 0/25 | 0/25 |
| 5 | 70 | 25 | 5 | 0 | 2.6 | 4.5 | 0.58 | 85.6 | 0/25 | 0/25 | 0/25 |
| 6 | 70 | 25 | 5 | 0 | 2.7 | 4.3 | 0.63 | 74.0 | 0/25 | 0/25 | 0/25 |
| 7 | 75 | 19.5 | 5.5 | 0 | 2.5 | 4.5 | 0.55 | 80.0 | 0/25 | 0/25 | 0/25 |

TABLE 3

| | mixing ratio [wt %] | | | | characteristic | | | | TCT [poor/samples] | HTB (60 C.:90%) | |
|---|---|---|---|---|---|---|---|---|---|---|---|
| | | | | | linear thermal expansivity × $10^{-5}$ [1/C] | | | | 150 [cycle] | 150 [H] | 400 [H] |
| sample No. | silica | PPS | adhesion agent | glass fiber | flow ($\alpha$) | normal ($\beta$) | ratio ($\alpha/\beta$) | strength [MPa] | | | |
| 1 | 70 | 30 | 0 | 0 | 2.9 | 4.7 | 0.52 | 110.1 | 1/3 | X | — |
| 2 | 69 | 28 | 3 | 0 | 2.8 | 4.5 | 0.62 | 85.0 | 0/3 | ◯ | ◯ |
| 3 | 75 | 20 | 5 | 0 | 2.5 | 3.1 | 0.81 | 87.4 | 0/3 | ◯ | ◯ |

TABLE 3-continued

| | mixing ratio [wt %] | | | | characteristic | | | | | | |
|---|---|---|---|---|---|---|---|---|---|---|---|
| | | | | | linear thermal expansivity × 10⁻⁵ [1/C] | | | flexural | TCT [poor/samples] | HTB (60 C.:90%) | |
| sample No. | silica | PPS | adhesion agent | glass fiber | flow (α) | normal (β) | ratio (α/β) | strength [MPa] | 150 [cycle] | 150 [H] | 400 [H] |
| 4 | 70 | 25 | 5 | 0 | 2.6 | 4.5 | 0.58 | 85.6 | 0/3 | ○ | ○ |
| 5 | 70 | 25 | 5 | 0 | 3.3 | 5.5 | 0.60 | 74.0 | 2/3 | ○ | ○ |
| 6 | 75 | 19.5 | 5.5 | 0 | 2.5 | 4.5 | 0.55 | 80.0 | 0/3 | ○ | ○ |

What is claimed is:

1. A thermoplastic material for sealing a part of a lead frame and a semiconductor element electrically coupled with the lead frame, consisting essentially of:
   thermoplastic resin,
   wherein the thermoplastic material has a linear thermal expansivity of about 4.5×10–5 (1/° C.) or less at about 150–200° C.

2. The thermoplastic material according to claim 1, wherein the flexural strength of the thermoplastic material is about 74[MPa] or more.

3. A semiconductor device comprising:
   at least one lead for electrically connecting to an external element,
   a semiconductor element electrically coupled to the lead, and
   a package formed from the thermoplastic material for sealing the semiconductor element and a part of the lead according to claim 1.

4. A process for manufacturing a semiconductor device, comprising the steps of:
   electrically interconnecting a semiconductor element with one end of a conductor, and
   sealing the semiconductor element and the one end of the conductor with a thermoplastic material according to claim 1.

5. A thermoplastic material for sealing a part of a lead frame and a semiconductor element electrically coupled with the lead frame, consisting essentially of:
   a thermoplastic resin,
   wherein the thermoplastic material has a ratio of B1 to A1 of 0.55 or more for linear thermal expansivity where A1 is in the direction of flowing the thermoplastic material, and B 1 is in the normal direction of flowing the thermoplastic material after hardening.

6. The thermoplastic material according to claim 5, wherein the flexural strength of the thermoplastic material is about 74[MPa] or more.

7. A semiconductor device comprising:
   at least one lead for electrically connecting to an external element,
   a semiconductor element electrically coupled to the lead, and
   a package formed from the thermoplastic material for sealing the semiconductor element and a part of the lead according to claim 2.

8. A process for manufacturing a semiconductor device, comprising the steps of:
   electrically interconnecting a semiconductor element with one end of a conductor, and
   sealing the semiconductor element and the one end of the conductor with a thermoplastic material according to claim 5.

9. A thermoplastic material for sealing a part of a lead frame and a semiconductor element electrically coupled with the lead frame, consisting essentially of:
   a Polyphenylene Sulfide,
   wherein the thermoplastic material has a linear thermal expansivity of about 4.5×10–5 (1/° C.) or less at about 150–200° C.,
   wherein the thermoplastic material has a ratio of B1 to A1 of 0.55 or more for linear thermal expansivity where A1 is in the direction of flowing the thermoplastic material, and B 1 is in the normal direction of flowing the thermoplastic material after hardening,
   wherein the thermoplastic material is substantially free of thermosetting materials, and
   wherein the fibrous material is substantially free of thermosetting materials.

10. The thermoplastic material according to claim 9, wherein the flexural strength of the thermoplastic material is about 74[MPa] or more.

11. A semiconductor device comprising:
    at least one lead for electrically connecting to an external element,
    a semiconductor element electrically coupled to the lead, and
    a package formed from the thermoplastic material for sealing the semiconductor element and a part of the lead according to claim 3.

12. A process for manufacturing a semiconductor device, comprising the steps of:
    electrically interconnecting a semiconductor element with one end of a conductor, and
    sealing the semiconductor element and the one end of the conductor with a thermoplastic material according to claim 3.

13. A thermoplastic material for sealing a part of a lead frame and a semiconductor element electrically coupled with the lead frame, comprising:
    a thermoplastic resin; and
    grained particles in the thermoplastic resin;
    wherein the thermoplastic material has a linear thermal expansivity of about 4.5×10–5 (1/° C.) or less.

14. The thermoplastic material according to claim 13, wherein the ratio of the linear expansivity of the thermoplastic material in the flow direction to the linear expansivity in the direction normal to the flow direction is about 0.55 or more.

15. The thermoplastic material according to claim 13, wherein the thermoplastic material is substantially free of thermosetting materials.

16. The thermoplastic material according to claim 13, wherein the fibrous material is substantially free of thermosetting materials.

17. The thermoplastic material according to claim 13, wherein the flexural strength of the thermoplastic material is about 74 MPa or more.

18. The thermoplastic material according to claim 13, further comprising an adhesion agent having at least one polar group in the resin.

19. The thermoplastic material according to claim 13, further comprising an adhesion agent having at least one polar group in the resin, and
wherein the ratio of the ratio by weight of the adhesion agent to the thermoplastic resin and the ratio by weight of the thermoplastic resin to the thermoplastic material is about 0.28 or less.

20. The thermoplastic material according to claim 13, wherein the grained particles have an average diameter of about 10 microns or less.

21. A thermoplastic material for sealing a part of a lead frame and a semiconductor element electrically coupled with the lead frame, comprising:
a thermoplastic resin; and
grained particles in the thermoplastic resin;
wherein the ratio of the linear expansivity of the thermoplastic material in the flow direction to the linear expansivity in the direction normal to the flow direction is about 0.55 or more.

22. The thermoplastic material according to claim 21, wherein the thermoplastic material is substantially free of thermosetting materials.

23. The thermoplastic material according to claim 21, wherein the fibrous material is substantially free of thermosetting materials.

24. The thermoplastic material according to claim 21, wherein the flexural strength of the thermoplastic material is about 74 MPa or more.

25. The thermoplastic material according to claim 21, further comprising an adhesion agent having at least one polar group in the resin.

26. The thermoplastic material according to claim 21, further comprising an adhesion agent having at least one polar group in the resin, and
wherein the ratio of the ratio by weight of the adhesion agent to the thermoplastic resin and the ratio by weight of the thermoplastic resin to the thermoplastic material is about 0.28 or less.

27. The thermoplastic material according to claim 21, wherein the grained particles have an average diameter of about 10 microns or less.

* * * * *